United States Patent
Lesmeister

[19]

[11] Patent Number: 6,101,622
[45] Date of Patent: Aug. 8, 2000

[54] ASYNCHRONOUS INTEGRATED CIRCUIT TESTER

[75] Inventor: Gary J. Lesmeister, Hayward, Calif.

[73] Assignee: Credence Systems Corporation, Fremont, Calif.

[21] Appl. No.: 09/067,312

[22] Filed: Apr. 27, 1998

[51] Int. Cl.[7] ........................................... G01R 31/28
[52] U.S. Cl. ............................................. 714/724
[58] Field of Search ................... 714/724, 738; 365/201; 324/73–1, 763

[56] References Cited

U.S. PATENT DOCUMENTS 5,835,506  11/1998  Kuglin ............................. 714/738
5,948,115   9/1999  Dinteman ......................... 714/738

OTHER PUBLICATIONS

Narayanan, Asynchronous Multiple Scan Chanis, IEEE, pg. 270–276, 1995.

Primary Examiner—Albert De Cady
Assistant Examiner—Shelly A Chase
Attorney, Agent, or Firm—Daniel J. Bedell; Smith-Hill and Bedell

[57] ABSTRACT

An asynchronous integrated circuit (IC) tester includes a set of channels interconnected by a runtime bus. Each channel accesses a separate terminal of an IC device under test (DUT) for carrying out test activities during successive cycles of a test. During each cycle of a test, each channel may transmit a test signal to the DUT, sample a DUT output signal and store sample data representing the logic state of the DUT output signal, and/or compare previously stored sample data to expected patterns to determine if the DUT is operating correctly. Any channel may be programmed to place a MATCH code on the runtime bus when it recognizes, or fails to recognize, a particular logic pattern in the DUT output signal. Other channels may be programmed to pause their comparison activities until they receive the MATCH code over the runtime bus. Thus a DUT output signal event detected by any one channel triggers test activities by other channels.

8 Claims, 3 Drawing Sheets

ASYNCHRONOUS INTEGRATED CIRCUIT TESTER

BACKGROUND OF THE INVENTION

1. Field of the Invention

The present invention relates in general to integrated circuit testers and in particular to an integrated circuit tester capable of testing asynchronous integrated circuit devices.

2. Description of Related Art

A typical integrated circuit (IC) tester includes a separate channel for each terminal of an IC device under test (DUT). The tester organizes an IC test into a succession of test cycles, and during each test cycle, each channel may either send a test signal to a DUT terminal or monitor a DUT output signal at the terminal to determine if the DUT is behaving as expected. The actions each channel carries out during each test cycle are controlled by data (a "test vector") provided to each channel at the start of each test cycle. Each vector may indicate not only an action the channel is to carry out during a test cycle, but may also indicate a particular time during the test cycle the channel is to carry out the action. Thus the sequence of vectors provided to each channel during a test totally defines the channel's behavior during the test. A vector telling a channel to sample a DUT output signal at some time during a test cycle may also include "EXPECT" data indicating an expected state of the DUT output signal. The tester compares the EXPECT data to the sample DUT output to determine when the DUT has failed. Some testers allow a channel detecting a DUT failure to send an output FAIL signal to a central controller. The central controller can then signal the other channels to halt the test and to prepare to test another DUT.

In some testers a central controller provides vectors to each channel before the start of each test cycle. In other testers each channel includes a memory for storing a set of test vectors and a sequencer for sequentially addressing the memory so that it reads out a test vector before the start of each test cycle. In still other testers, a vector-generating algorithm is stored in each channel's memory and each channel includes an instruction processor for executing the algorithm to produce a vector for each test cycle.

Integrated circuit testers are synchronous devices. Each channel times state changes in the test signal it sends to the DUT and times its sampling of a input signal from the DUT with reference to a common master clock signal. The sequence of vectors supplied to a channel completely defines the sequence of actions the channel takes and the times at which those actions are to occur. Thus testers are "time driven" in the sense that the actions the tester's channels carry out depend only on the passage of time and not on occurrence of any particular events. Since the sequence and timing of test actions a tester performs must follow a predetermined time-driven script, an integrated circuit tester is not well adapted for testing DUT's producing output signals that change state at unpredictable times. For example if a DUT is a synchronous device having its own internal clock, it must either communicate asynchronously with the outside world, or must provide its internal clock signal to any external device it communicates with so that the external device can synchronize its activities to those of the DUT. Since conventional IC testers operate from their own master clocks, and since the DUT's clock is not synchronized to the tester's master clock, a conventional tester can't predict precisely when the DUT is going to carry out some action. For example, the tester can't precisely tell when the DUT's output data is valid. Since the vector sequence programming a conventional tester can only tell the tester to sample the DUT's output signals at certain times with respect to the tester's master clock, a conventional IC tester can't test such a DUT as it is used or simulated.

What is needed is an IC tester that can fully test a DUT that is not synchronized to the tester's master clock. Such a tester should be able to communicate with the DUT asynchronously and should be "event driven" in the sense that it should be able to take actions initiated by state changes in the DUT output signals in addition to actions initiated merely by the passage of time relative to its own master clock signal.

SUMMARY OF THE INVENTION

In accordance with the present invention, an asynchronous integrated circuit (IC) tester includes a set of channels interconnected by a runtime bus allowing the channels to communicate with one another during a test. Each channel accesses a separate terminal of an IC device under test (DUT) and, during each cycle of the test, each channel may transmit a test signal to the DUT, sample a DUT output signal and store sample data representing the logic state of the DUT output signal, and/or compare stored sample data. Any channel may be programmed to place a MATCH code on the runtime bus when it recognizes a particular logic pattern in its stored sample data. Other channels may be programmed to pause or continue to repeat their test activities until they receive the MATCH code via the runtime bus. Thus an event in a DUT output signal, or pattern of events in the DUT output signal can be detected by any one channel which may then trigger test activities of other channels.

It is accordingly an object of the invention to provide an asynchronous IC tester that can trigger test activities in response to detected events.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Tester Architecture

Figure 1:
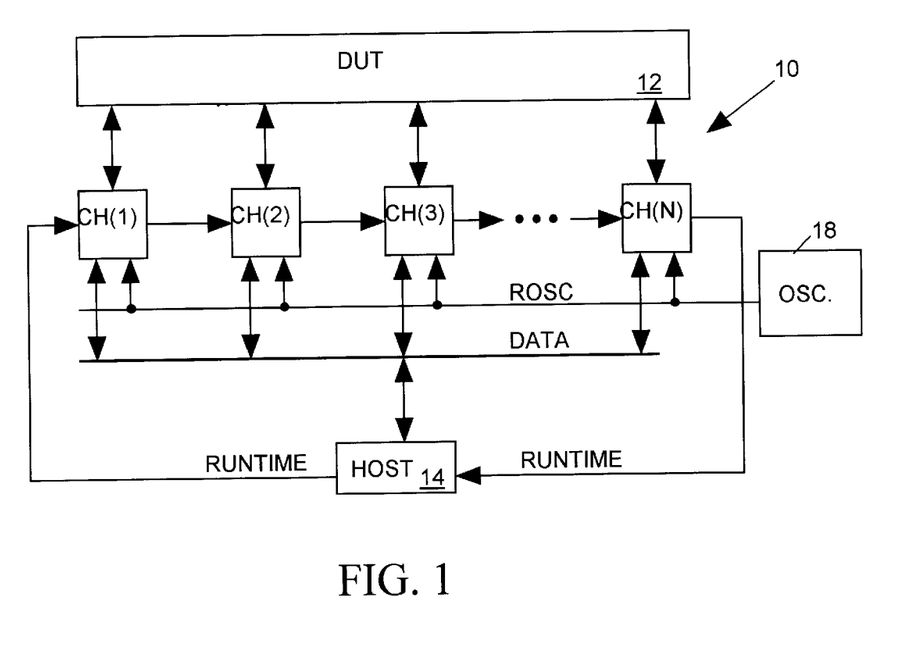
FIG. 1 illustrates in block diagram form an event driven integrated circuit tester in accordance with the present invention.

FIG. 1 illustrates in block diagram form an "event driven" integrated circuit tester 10 in accordance with the present invention. Tester 10 includes a set of N tester channels CH(1)–CH(N), one for each terminal of an IC device under test (DUT) 12. Tester 10 organizes an IC test into a succession of test cycles, and during each test cycle each channel may send a test signal to a DUT terminal and/or sample a DUT output signal at the terminal to determine if DUT 12 is behaving as expected. Before the start of a test, a host computer 14 writes a program into a memory within each channel CH(1)–CH(N) via a conventional computer bus (DATA). During the test, each channel CH(1)–CH(N) executes the program stored in its memory to produce a sequence of vectors. Each vector tells the channel the action or actions it is to carry out during a test cycle and also indicates particular times during the test cycle the channel is to carry out the actions. Each channel references timing of its test activities to a master clock signal ROSC produced by an oscillator 18.

A 4-wire bus (RUNTIME) interconnecting channels CH(1)–CH(N) and host computer 14 allows them to communicate with one another during a test. After programming channels CH(1)–CH(N) via the DATA bus, host computer 14 sends a START code over the RUNTIME bus to tell the channels to begin a test. During the test, any channel CH(1)–CH(N) may use the RUNTIME bus to send an encoded message to host computer 14. For example, when one of channel CH(1)–CH(N) detects a DUT failure during a test, it can transmit an ERROR code over the RUNTIME bus to host computer 14. The ERROR code may tell host computer 14 to log the DUT as defective and to signal the tester's DUT handling components to prepare a next DUT for testing. The RUNTIME bus interconnects host computer 14 and channels CH(1)–CH(N) in a series loop so that codes sent on the RUNTIME bus pass from channel to channel. When, for example, host computer 14 sends the START code to the channels via the RUNTIME bus, the START code travels first to channel CH(1). Channel CH(1) holds the code for one test cycle, and then forwards the code via the RUNTIME bus to channel CH(2). Channel CH(2) holds the message for one test cycle and then forwards it to channel CH(3). Each channel CH(3)–CH(N–1) forward the START code to a next channel with a similar delay. Channel CH(N) forwards the START message back to host computer 14. The host computer 14 or any channel CH(1)–CH(N) that originates transmission of a code on the RUNTIME bus counts the number of test cycles that occur after sending the code to determine when the code has passed around the loop and returned. The originating channel then blocks re-transmission of the code.

Thus, for example, when host computer 14 sends out the START code to channel CH(1), the Jth channel CH(J) receives the START code with a delay of J–1 test cycles thereafter. To ensure that the channels all start the test at the same time, host computer 14 programs each channel CH(J) to delay commencement of its test activities for N–J test cycles after receiving the START code. Thus despite having received the START code at different times, all channels CH(1)–CH(N) begin the test at the same time.

In accordance with the present invention, each channel CH(1)–CH(N) may be programmed to look for a pattern in the DUT output signal it monitors and to transmit a MATCH code to the other channels via the RUNTIME bus when it recognizes the pattern. The other channels may be programmed to commence or alter their test activities when the MATCH code appears on the RUNTIME bus. Thus test activities of channels CH(1)–CH(N) may be "event driven" in the sense that each channel's test activities can commence or change when some particular event occurs and not simply at times preordained by a sequence of vectors.

This event driven capability allows tester 10 to test DUT 12 asynchronously when activities of DUT 12 are not synchronized to the tester's master clock ROSC. Suppose, for example, DUT 12 operates under an internal clock that is not synchronized to the tester's master clock. In such case it is not possible for a sequence of vectors to tell a tester channel precisely when, relative to the tester's master clock, a DUT output signal will change state in response to some DUT input test signal. Since the varying phase differences of two clocks can cause metastable conditions between the two time domains, the DUT clock will shift in phase relative to a tester's clock and would cause a conventional tester to detect timing errors in the DUT output signals when in fact there are none.

However suppose the DUT produces a "data ready" signal at an output terminal monitored, for example, by channel CH(1) of tester 10 to indicate the validity of DUT output data appearing at a set of terminals monitored by one or more of the other channels CH(2)–CH(N). Channel CH(1) can be programmed to sample the data ready signal during successive test cycles to determine when it changes to a state indicating that the data is ready, and to send a MATCH code out on the RUNTIME bus to the other channels when it sees the data ready signal change state.

Of course, since it takes the MATCH code up to N test cycles to pass via the RUNTIME bus to the channels that are monitoring the DUT's data output terminals, the data at those terminals will no longer be valid by the time the MATCH code reaches those channels. However, host computer 14 may program the channels CH(2)–CH(N) monitoring the DUT data output signals to sample those data signals during each test cycle while channel CH(1) is monitoring the data ready signal, and to store data representing states of those test signals. When the Jth channel CH(J) receives the MATCH code, it responds by determining whether the sample data it stored J–1 cycles earlier (when channel CH(1) actually detected the data ready signal state change) matches an expected state, thereby to determine if the DUT produced the correct output data. Thus, while the actions of sampling DUT data output signals and storing sample data are "time driven" by the tester's master clock, the action of comparing the stored sample data to an expected value is "event driven" by the change of state in the DUT's output data ready signal. Accordingly it may be seen that tester 10 is able to communicate with DUT 12 asynchronously irrespective of the lack of coherence between the two systems' clocks, to determine when DUT 12 is producing output data and to determine whether that output data is of an expected value.

Channel Architecture

Figure 2:
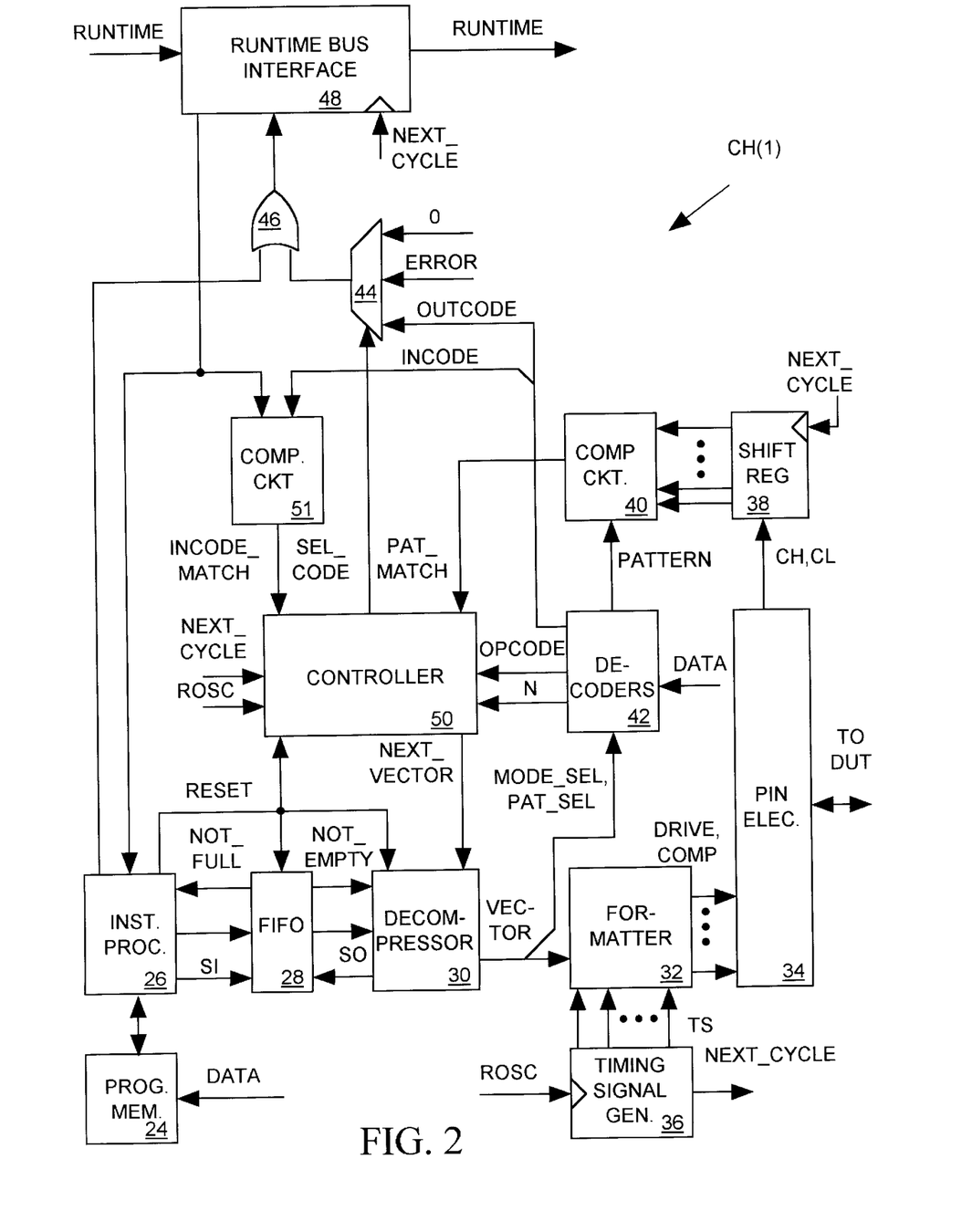
FIG. 2 illustrates tester channel CH(1) of FIG. 1 in more detailed block diagram form.

FIG. 2 illustrates tester channel CH(1) of FIG. 1 in more detailed block diagram form. Channels CH(2)–CH(N) are similar. Channel CH(1) includes a program memory 24 for receiving and storing a program from host computer 14 via the DATA bus before the start of the test. During the test an instruction processor 26 executes the program stored in program memory 24 to produce a sequence of data words (DATA) that it stores in a first-in/first-out (FIFO) buffer 28. Instruction processor 26 asserts a shift-in (SI) signal to load a DATA value into FIFO buffer 28 whenever FIFO buffer 28 asserts a NOT_FULL signal indicating it has additional storage capacity.

Each DATA value stored in FIFO buffer 28 is a compressed version of a set of one or more vectors. When FIFO buffer 28 asserts a NOT_EMPTY signal, indicating that it is storing data, a decompressor circuit 30 pulses a shift-out (SO) signal to read a next DATA word out of FIFO buffer 28. Decompressor circuit 30 decompresses each read out DATA word to produce a sequence of one or more vectors. Decompressor circuit 30 sends a vector to a formatter circuit 32 at the start of a test cycle in response to each pulse of an input NEXT[13] VECTOR signal. During each test cycle, formatter 32 sends a set of control signals (DRIVE and COMP) to a pin electronics circuit 34. Formatter 32 produces state changes in the DRIVE and COMP control signals at times indicated by the current vector output of decompressor 30 using a set of timing signals TS as timing references. A timing signal generator 36 clocked by the ROSC signal produces the timing signals TS and also produces a NEXT_CYCLE signal pulse to mark the start of each test cycle. The timing signals TS have the same frequency as the NEXT_CYCLE pulse but are distributed in phase to provide formatter 32 with a high resolution timing reference for state changes in its output DRIVE and COMP signals.

State changes in the DRIVE signals tell pin electronics circuit 34 when to drive a test signal input to the DUT to a high or low logic state or to a tristate condition. State changes in a COMP signal tells pin electronics circuit 34 when to sample the DUT's output signal. In accordance with the invention, when pin electronics circuit 34 samples the DUT output signal, it compares the sampled signal level to the DUT's high and low logic levels and supplies output compare high and compare low bits (CH and CL) to a serial-in/parallel-out shift register 38 having a shift-in input clocked by the NEXT_CYCLE signal. The CH and CL bits respectively indicate whether the sampled DUT output signal level is higher than the DUT's high logic level or lower than the DUT's low logic level.

The CH and CL data stored in shift register 38 thus represent a history of the sampled behavior of the DUT output signal over several test cycles. That data provides input to a compare circuit 40 which compares the data pattern in shift register 38 to data (PATTERN) provided by a programmable decoder 42. The vector output of decompressor 30 includes a pattern selection field (PAT_SEL) provided to decoder 42, and decoder 42 decodes the PAT_SEL field to produce the PATTERN data supplied to compare circuit 40. Host computer 14 of FIG. 1 programs decoder 42 via the DATA bus before starting the test to establish relationships between values of PAT_SEL input to decoder 42 and its PATTERN data output. When the output of shift register 38 matches the PATTERN data, compare circuit 40 produces a PAT_MATCH signal providing input to a controller circuit 50.

Decoder 42 also receives and decodes an input "mode selection" field (MODE_SEL) also included in the vector output of decompressor 30 to supply a code (OPCODE) and a data value N to controller 50, to supply a 4-bit code OUTCODE as an input to a multiplexer 44, and to supply a 4-bit code INCODE as input to a compare circuit 51. The OPCODE and N data tells controller 50 how to respond to its other inputs signals during each test cycle. The OUTCODE may be a MATCH or ERROR code that can be sent outward on the RUNTIME bus during the next test cycle in response to some event detected by the channel. The INCODE indicates the value of a MATCH code that may arrive on the RUNTIME bus during the test cycle.

Multiplexer 44 normally supplies a 4-bit "0" code via a set of OR gates 46 to a RUNTIME bus interface circuit 48. The RUNTIME bus interface circuit 48 ignores that "0" code and simply forwards any code appearing on its input RUNTIME bus to its output RUNTIME bus at the start of each test cycle indicated by a pulse of the NEXT_CYCLE signal. However the OPCODE input to controller 50 may tell it to respond to state changes in its input signals (for example a state change in the PAT_MATCH signal) by setting an output signal SEL_CODE controlling multiplexer 44 so that multiplexer 44 now forwards either the OUTCODE provided by decoder 42 or a hard-wired ERROR code input through OR gates 46 to a RUNTIME bus interface circuit 48. On the next pulse of the NEXT_CYCLE signal, interface circuit 48 will forward that code outward to the next channel via the RUNTIME bus.

Bus interface circuit 48 also forwards any codes arriving on the RUNTIME bus to instruction processor 26 and to an input of compare circuit 51. When compare circuit 51 determines that the code conveyed on the RUNTIME bus matches the INCODE from decoder 42, it asserts an INCODE_MATCH signal input to controller 50.

In addition to its OPCODE and N data inputs, controller 50 receives as inputs the NEXT_CYCLE signal, the INCODE_MATCH signal, the PAT_MATCH signal and a RESET signal from instruction processor 26. In a "time driven" mode of operation, as selected by its OPCODE input, controller 50 sends a NEXT_VECTOR signal pulse to decompressor 30 at the start of each test cycle causing decompressor 30 to send a new vector to formatter 32. When the OPCODE input to controller 50 selects an "event driven" mode of operation, controller 50 refrains from pulsing the NEXT_VECTOR signal until it detects a particular pattern of events in its input signals referenced by the OPCODE. Controller 50 then pulses the NEXT_VECTOR signal on a next edge of the NEXT_CYCLE signal. In the meantime, decompressor 30 continues to supply the same vector to formatter 32. Formatter 32 therefore repeatedly executes the action(s) indicated by that vector for each successive test cycle until it receives a new input vector.

The OPCODE and N data inputs to controller 50 also tell controller 50 when and how and when to set states of its output SEL_CODE data controlling which of its input codes multiplexer 44 sends to interface circuit 48. For example, the OPCODE and N data can tell controller 50 to trigger a NEXT_VECTOR pulse or set the SEL_CODE data to a particular value upon the appearance or non-appearance of a particular code on the RUNTIME bus as indicated by the INCODE_MATCH signal, or in response to the appearance or non-appearance of particular pattern in shift register 38 as indicated by the PAT_MATCH signal. The OPCODE and N data may also specify that controller 50 is to simply wait for N NEXT_CYCLE signal pulses after producing a NEXT_VECTOR pulse before producing another NEXT_VECTOR pulse, or to wait for N NEXT_CYCLE signal pulses after detecting a INCODE_MATCH or PAT_MATCH signal before producing another NEXT_VECTOR signal pulse.

Vector Format

The output vector of decompressor 30 has the following format:

[ACTION, TIME, MODE_SEL, PAT_SEL]

The ACTION and TIME fields are supplied to formatter 32. The ACTION field defines DRIVE and COMP signal state changes formatter 32 is to initiate during a test cycle and the TIME field indicates times at which the DRIVE and COMP signals are to change state. Decoder 42 decodes the MODE_SEL field to produce the OPCODE, N, OUTCODE and INCODE data and decodes the PAT_SEL to produce the PATTERN data input to compare circuit 40.

RUNTIME Bus Codes

Since the runtime bus has 4-bits, any of 15 different codes may be sent on the runtime bus. (The lines of the RUNTIME bus are held high by default so a "1111" appears on the RUNTIME bus when no code is being sent.) The relationship between the meaning and value of each code, the reason a channel sends a code on the RUNTIME bus, and a channel's response to the code are all determined by the programming of decoder 42, the arrangement of codes in register 45 and the sequence of vectors provided to formatter 32 during the test. The RUNTIME bus codes may be used for the following functions:

START: Host computer 14 of FIG. 1 sends the START code on the RUNTIME bus to initiate a test. The START code tells instruction processor 26 to begin writing DATA words into FIFO buffer 28. The START signal also tells controller 50 to pulse the next NEXT_VECTOR signal after a few test cycles have passed. The delay allows instruction processor 26 time to generate and store data in FIFO buffer 28 and allows decompressor 30 time to read data out of FIFO buffer 28 and to decompress that data to produce the first vector. (The first vector output of decompressor 30 does not tell the pin electronics circuit 34 to do anything but includes an OPCODE that tells controller 50 to wait N of cycles before generating a next NEXT_VECTOR pulse. The value of N is set in an inverse relation to the number of test cycles the START signal requires to reach the channel so that formatters 32 in all channels receive a next test vector at the same time, thereby to start testing the DUT concurrently.)

ERROR: Controller 50 may signal multiplexer 44 to send the ERROR code to the host computer via the RUNTIME bus in response to some pattern of events in its input signals indicating that the DUT is defective. The host computer 14 may, for example, respond to the ERROR code by signaling DUT handling equipment to remove the defective DUT from the tester and replace it with another DUT to be tested. The host computer may thereafter send a START code out on the RUNTIME bus to restart the test.

MATCH: The OUTCODE supplied to multiplexer 44 may be a MATCH code that is to be sent outward on the RUNTIME bus when compare circuit 40 detects a particular pattern in the shift register 38. Compare circuit 40 signals controller 50 when it detects a match by setting the PAT_MATCH signal true. The OPCODE input to controller 50 may tell it to signal multiplexer 44 to deliver the OUTCODE as the MATCH code to interface 48. When the compare circuits 51 of other channels detect that MATCH code and assert their output INCODE_MATCH signals, their local controllers 50 may initiate a next phase of the test by pulsing their NEXT_VECTOR output signals.

END: The OUTCODE input to multiplexer 44 may be an END code indicating that the test is over. The MODE_SEL of the last test vector supplied to formatter 32 may tell decoder 42 to produce OPCODE and N data telling controller 50 to tell multiplexer 44 to send the END code out on the RUNTIME bus to tell host computer 14 that the test is over.

RESET: Host computer 14 may send a RESET code on the RUNTIME bus after it receives an END or an ERROR code or before sending a START code. The RESET code tells the instruction processor 26 of each channel CH(1)–CH(N) to clear the local FIFO buffer 28, to reset decompressor 30, and to reset controller 50 to a state where it awaits the START code. The RESET code also tells instruction processor 26 to stop loading data into the local FIFO buffer 28 and to await the START signal.

Asynchronous Testing Operation

As discussed briefly above, DUT 12 of FIG. 1 may employ a form of asynchronous communication in which it pulls down a "data ready" signal at an output terminal monitored by channel CH(1) when output data it produces at a set of terminals monitored by one or more of the other channels CH(2)–CH(N) is valid. In such case, a vector output of the channel CH(1) decompressor 30

1. tells formatter 32 to sample the data ready signal during each successive test cycle,
2. tells decoders 42 to provide PATTERN data to compare circuit 40 matching the expected shift register 38 output pattern expected when pin electronics circuit 34 samples an asserted data ready signal,
3. tells decoders 42 to provide an OUTCODE to multiplexer 44 conveying a particular MATCH code; and
4. tells decoders 42 to provide controller 50 with OPCODE and N data telling it to pulse the NEXT_VECTOR signal and to switch multiplexer 44 to send the MATCH code to interface 48 when the PAT_MATCH signal is asserted, and alternatively, when the PAT_MATCH signal is not asserted within N cycles, to signal multiplexer 44 to send the ERROR code out on the RUNTIME bus.

In the meantime, in any channel CH(2)–CH(N) that is to monitor a DUT data output signal, the decompressor 30 output vector 1. tells formatter 32 to sample the DUT output signal,
2. tells decoder 42 to produce PATTERN data telling compare circuit 40 to look for a particular shift register 38 output data pattern that would be expected at the time the incoming MATCH code arrives at compare circuit 51,
3. tells decoder 42 to provide INCODE data to compare circuit 51 that is similar to the expected incoming MATCH code, and
4. tells decoder 42 to send OPCODE and N data to controller 50 telling to respond to the next INCODE_MATCH assertion by pulsing the NEXT_VECTOR signal and, if the INCODE_MATCH signal is not asserted at that point, by switching multiplexer 44 so that it sends the ERROR code outward on the RUNTIME bus.

RUNTIME Bus Interface

Figure 3:
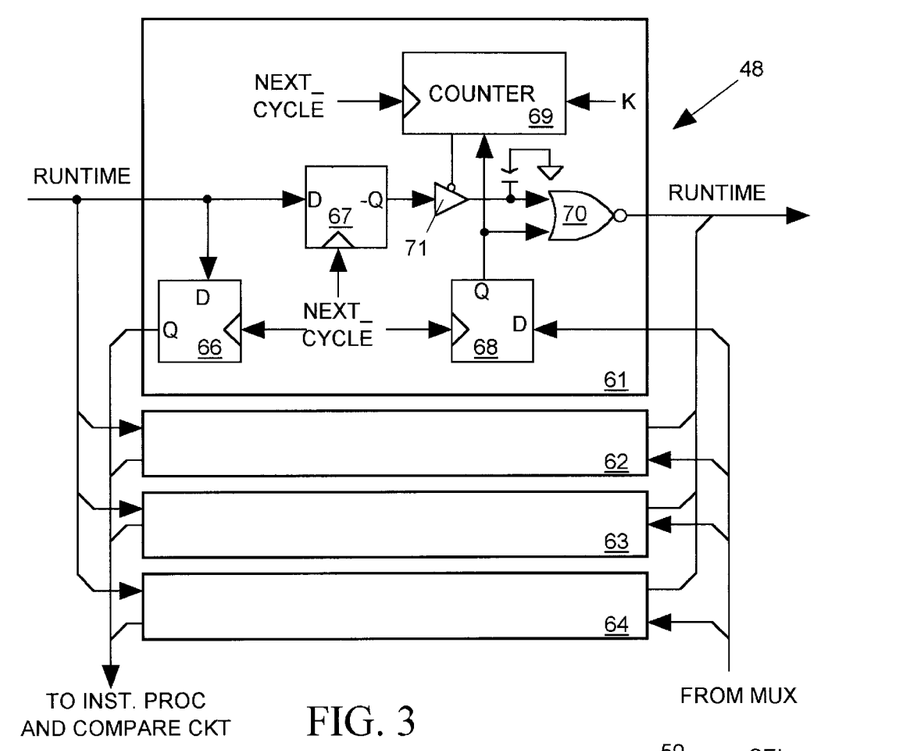
FIG. 3 illustrates the runtime bus interface of FIG. 2 in more detailed block diagram form.

FIG. 3 illustrates the runtime bus interface 48 of FIG. 2. Bus interface 48 includes a set of four similar interface units 61–64, one for each line of the RUNTIME bus. Each interface unit 61–64 includes a set of three type D flip-flops 66–68, a counter 69, a NOR gate 70 and a tristate driver 71. A line of the incoming RUNTIME bus drives the D input of flip-flops 66 and 67. One of the four lines from OR gate 46 of FIG. 2 drives the D input of flip-flop 68. The Q output of the flip-flop 66 of each interface unit 61–63 delivers a separate bit of the 4-bit code on the incoming RUNTIME bus to instruction processor 26 and compare circuit 51 of FIG. 2. Tristate driver 71 receives the –Q output of flip-flop 67 and drives an input to NOR gate 70. The Q output of flip-flop 68 drives a second input of NOR gate 70. NOR gate 70 drives one of the output RUNTIME bus lines. Counter 69 controls the tristate control input of driver 71.

The NEXT_CYCLE signal clocks all three flip-flops 66–68. Each of the four lines of the input RUNTIME bus are normally high unless pulled down by the bus interface circuit of the preceding channel. Counter 69 normally enables tristate driver 71 so that it passes the –Q output of flip-flop 67 to NOR gate 70. When a preceding stage pulls the RUNTIME bus signal input to flip-flop down, flip-flop 67 drives its –Q signal up on the next NEXT_CYCLE signal pulse, thereby causing NOR gate 70 to pull down on its RUNTIME bus output line. On the same NEXT_CYCLE signal pulse, flip-flop 66 drives its Q output low to deliver one bit of the code on the incoming RUNTIME bus to instruction processor 26 and compare circuit 51 of FIG. 2.

On the next NEXT_CYCLE pulse after multiplexer 44 of FIG. 2 drives the D input of flip-flop 68 high, the Q output of flip-flop 68 goes high to pull the outgoing RUNTIME bus down via NOR gate 70. The rising edge of the Q output of flip-flop 68 loads a value K into counter 69. K is the number of test cycles required for a code to completely circumnavigate the RUNTIME bus loop and return to interface circuit 48 on the incoming RUNTIME bus. Thereafter counter 69 counts pulses of the NEXT_CYCLE signal down from K and when the count reaches zero, counter 69 tristates buffer 71 for one test cycle leaving the code set to a zero to prevent flip-flop 67 from forwarding the returning code bit.

Vector Decompression and Formatter Circuits

The vector generating system of FIG. 2, including memory 24, instruction processor 26, FIFO buffer 28 and decompressor 30, is generally similar to a vector generating system detailed in U.S. patent application Ser. No. 08/534,015, filed Sep. 25, 1995, by Gary J. Lesmeister, the entire disclosure of which is incorporated by reference herein. That same patent discloses details of a formatting system similar to formatter 32. It will be appreciated by those skilled in the art that many other types of well-known vector generation systems could be employed in the tester channel architecture without departing from the invention. For example a relatively simple sequencer clocked by the NEXT_VECTOR signal could provide a succession of addresses to a vector memory storing a sequence of vectors so that the vector memory reads out a next vector to formatter 32 on each pulse of the NEXT_VECTOR signal.

Controller Circuit

Figure 4:
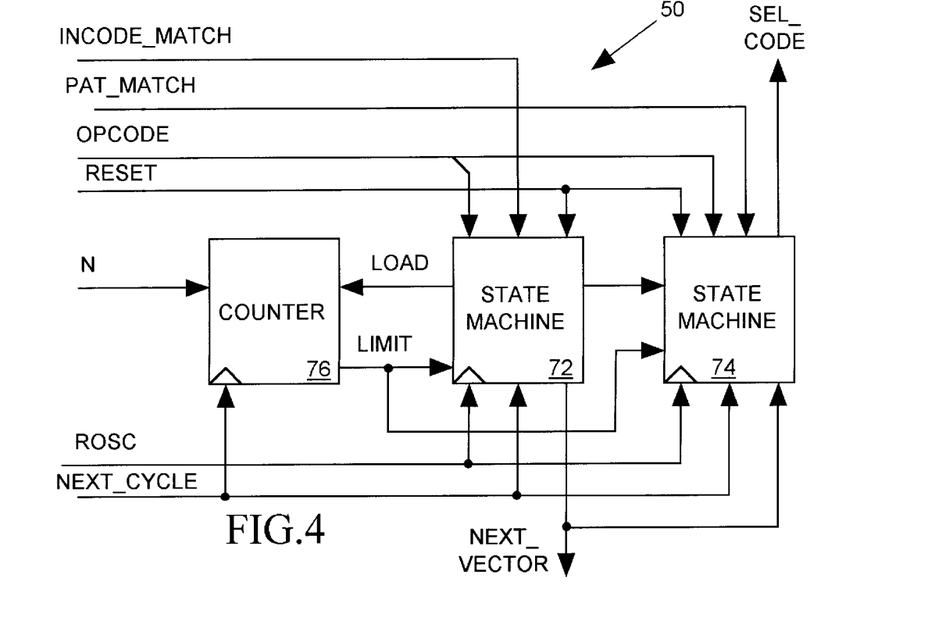
FIG. 4 illustrates the controller circuit of FIG. 2 in more detailed block diagram form.

FIG. 4 illustrates controller circuit 50 of FIG. 2 in more detail. Controller circuit 50 includes two state machines 72 and 74, and a counter 76. The system master clock signal ROSC clocks state machines 72 and 74 while the NEXT_CYCLE signal clocks counter 76. Counter 76 loads the N value input in response to a LOAD signal pulse from state machine 72, then counts NEXT_CYCLE pulses down from N until the count reaches 0. At that point counter 76 asserts an output LIMIT signal providing input to each of state machines 72 and 74. The RESET, INCODE_MATCH and PAT_MATCH signals provide additional inputs to state machines 72 and 74. Each state machine 72 and 74 also receives a portion of the OPCODE. State machine 72 generates the NEXT_VECTOR signal while state machine 74 generates the SEL_CODE signal.

Shortly after pulsing a NEXT_VECTOR signal state machine 72 pulses the LOAD signal to load the N value into counter 76. The portion of the OPCODE field supplied to state machine 72 selects one of the following operating modes:

1. Pulse NEXT_VECTOR after receiving a NEXT_CYCLE pulse. (This is the "time driven" mode, and is the mode state machine 72 also enters after receiving a RESET pulse.
2. Pulse NEXT_VECTOR on receiving a next NEXT_CYCLE pulse after receiving a LIMIT pulse.
3. Pulse NEXT_VECTOR on next NEXT_CYCLE pulse after detecting a PAT_MATCH assertion.
4. Pulse NEXT_VECTOR on next NEXT_CYCLE pulse after detecting a INCODE_MATCH assertion.
5. Pulse NEXT_VECTOR on next NEXT_CYCLE pulse after detecting a PAT_MATCH assertion.

State machine 74 also receives the NEXT_VECTOR output of state machine 72, and in response to each pulse of the NEXT_VECTOR signal, state machine 74 sets its SEL_CODE data output to cause multiplexer 44 to send the "0" code to interface 48 of FIG. 2. Thereafter the portion of the OPCODE field supplied to state machine 74 selects one of the following operating modes:

1. Set SEL_CODE to cause multiplexer 44 to forward the ERROR code on receiving the next NEXT_CYCLE pulse if the PAT_MATCH signal is not asserted. (This is the default "time driven" mode and is the mode state machine 74 also enters after receiving a RESET pulse.
2. Set SEL_CODE to cause multiplexer 44 to forward the ERROR code on receiving a next NEXT_CYCLE pulse after the LIMIT signal is asserted.
3. Set SEL_CODE to cause multiplexer 44 to forward the ERROR code on receiving a next NEXT_CYCLE pulse after the INCODE_MATCH signal is asserted if the PAT_MATCH signal is also asserted.
4. Set SEL_CODE to cause multiplexer 44 to forward the ERROR code on receiving a next NEXT_CYCLE pulse after the INCODE_MATCH signal is asserted if the PAT_MATCH signal is not asserted.
5. Set SEL_CODE to cause multiplexer 44 to forward the OUTCODE on receiving a next NEXT_CYCLE pulse after the INCODE_MATCH signal is asserted if the PAT_MATCH signal is also asserted.
6. Set SEL_CODE to cause multiplexer 44 to forward the OUTCODE on receiving a next NEXT_CYCLE pulse after the INCODE_MATCH signal is asserted if the PAT_MATCH signal is not asserted.
7. Set SEL_CODE to cause multiplexer 44 to forward the OUTCODE on receiving a next NEXT_CYCLE pulse after the PAT_MATCH is asserted.
8. Set SEL_CODE to cause multiplexer 44 to forward the OUTCODE on receiving a next NEXT_CYCLE pulse after the LIMIT signal is asserted.
9. Make no change to SEL_CODE.

Thus has been shown and described an asynchronous integrated circuit tester in accordance with the present invention for testing a DUT that is not synchronized to the tester's master clock. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An asynchronous integrated circuit (IC) tester comprising:
    a bus for conveying a code; and
    a plurality of tester channels directly interconnected by said bus, each tester channel carrying out test activities at a terminal of an IC device under test (DUT), wherein said test activities include transmitting a test signal to the DUT terminal, repeatedly sampling a DUT output signal and storing a data sequence representing successively sampled states of the DUT output signal, sending a first code to others of said tester channels via said bus when said data sequence matches a predetermined pattern, receiving a second code via said bus, and initiating at least one of said test activities upon receiving said second code via said bus.

2. The asynchronous IC tester in accordance with claim 1 wherein said bus connects said tester channels in a series loop such that when any one of said channels sends said first code to via said bus, said first code travels via said bus to each of said other tester channels in succession and then returns to said any one tester channel.

3. The asynchronous IC tester in accordance with claim 2 wherein said tester channels carry out said test activities during a succession of test cycles, and wherein any one of said tester channels connected in said series loop, after receiving a code via said bus from a preceding one of said tester channels of said series loop during any one of said test cycles, forwards said code via said bus to a next tester channel of said series loop during a next one of said tester cycles.

4. The asynchronous IC tester in accordance with claim 1 wherein said tester channels carry out said test activities during a succession of test cycles, and wherein at least one of said tester channels comprises:
- a vector generator for generating a vector in response to each pulse of an input NEXT_VECTOR signal pulse, each generated vector referencing a test activity and a detectable event;
- test means responsive to each generated vector for carrying out the test activity referenced by the generated vector during each test cycle occurring after the vector is generated until said vector generating means generates a next vector, and
- event detector means responsive to each generated vector for providing an input NEXT_VECTOR signal pulse to said vector generator upon occurrence of the detectable event referenced by the generated vector.

5. The asynchronous IC tester in accordance with claim 4
- wherein one of the generated vectors references a test activity of sampling a DUT output signal, determining its logic state, and producing an indicating bit representing the determined logic state, and wherein the detectable event referenced by said vector comprises the occurrence of a pattern referenced by said vector in a sequence of such indicating bits produced during successive test cycles,
- wherein in response to said one of the generated vector, said test means carries out said test activity to produce said sequence of indicating bits, and
- wherein said event detector means stores the sequence of indicating bits as each indicating bit thereof is produced, and produces said NEXT_VECTOR signal pulse when the stored sequence matches said pattern.

6. The asynchronous IC tester in accordance with claim 4
- wherein each vector also references a code and an associated detectable event that is to trigger transmission of the code via said bus, and
- wherein said event detector means also transmits the referenced code via said bus upon detecting the associated detectable event.

7. A tester channel for an integrated circuit (IC) tester for carrying out test activities at a terminal of an integrated circuit device under test (DUT) during successive test cycles, wherein said test activities include sampling a DUT output signal produced at said DUT terminal, determining its logic state, and producing an indicating bit representing the determined logic state, the tester channel being connected to an input bus and an output bus, the tester channel comprising:
- means for generating a sequence of NEXT_CYCLE signal pulses, each indicating a start of each test cycle;
- a first compare circuit for receiving and comparing a first code and a second code and for producing a INCODE_MATCH signal of state indicating whether they match;
- a second compare circuit for receiving and comparing an indicating bit sequence and a data pattern and for producing a PAT_MATCH signal of state indicating whether they match;
- bus interface means for receiving said first code supplied as input to said tester channel via said input bus, for forwarding said first code from said channel via said output bus in response to a next pulse of said NEXT_CYCLE signal, for forwarding said first code to said compare means in respond to a next pulse of said NEXT_CYCLE signal, for receiving an input third code, and for forwarding said third code from said channel via said output bus in response to a next pulse of said NEXT_CYCLE signal;
- data generation means for responding to each pulse of an input NEXT_VECTOR signal by generating an output vector including data referencing said test activities, pattern selection (PAT_SEL) data referencing a data pattern to be provided as input to said second compare circuit, and mode selection (MODE_SEL) data;
- means for receiving the data of each generated vector referencing said test activities and for thereafter performing said test activities during each test cycle until said data generation means generates another output vector, thereby to produce an indicating bit sequence supplied as input to said second compare circuit;
- means for receiving the PAT_SEL data and for supplying the data pattern referenced thereby to said second compare circuit; and
- means for receiving the MODE_SEL data of each generated vector, for receiving the PAT_MATCH, INCODE_MATCH, and NEXT_CYCLE signals, for producing a pulse of the NEXT_VECTOR signal in response to a first pattern of state changes in said INCODE_MATCH, PAT_MATCH, and NEXT_CYCLE signals indicated by said MODE_SEL data, for transmitting a second code referenced by said MODE_SEL data to said first compare circuit, and for transmitting said third code referenced by said MODE_SEL data to said interface means to be forwarded on said output bus in response to a second pattern of state changes indicated by said MODE_SEL data.

8. An asynchronous integrated circuit (IC) tester comprising:
- a plurality of unidirectional buses for conveying codes, and
- a plurality of tester channels interconnected by said buses such that each tester channel has an input bus for receiving a code from another of said tester channels and an output bus for sending a code to another of said tester channels, wherein each channel for carrying out test activities at a terminal of an integrated circuit device under test (DUT) during successive test cycles, wherein said test activities include sampling a DUT output signal produced at said DUT terminal, determining its logic state, and producing an indicating bit representing the determined logic state, wherein each tester channel comprises
  - means for generating a sequence of NEXT_CYCLE signal pulses, each indicating a start of each test cycle;
  - a first compare circuit for receiving and comparing a first code and a second code and for producing a INCODE_MATCH signal of state indicating whether they match;
  - a second compare circuit for receiving and comparing an indicating bit sequence and a data pattern and for producing a PAT_MATCH signal of state indicating whether they match;
  - bus interface means for receiving said first code supplied as input to said tester channel via said input bus, for forwarding said first code from said channel via said output bus in response to a next pulse of said NEXT_CYCLE signal, for forwarding said first code to said compare means in respond to a next pulse of said NEXT_CYCLE signal, for receiving an input third code, and for forwarding said third code from said channel via said output bus in response to a next pulse of said NEXT_CYCLE signal;

data generation means for responding to each pulse of an input NEXT_VECTOR signal by generating an output vector including data referencing said test activities, pattern selection (PAT_SEL) data referencing a data pattern to be provided as input to said second compare circuit, and mode selection (MODE_SEL) data;

means for receiving the data of each generated vector referencing said test activities and for thereafter performing said test activities during each test cycle until said data generation means generates another output vector, thereby to produce an indicating bit sequence supplied as input to said second compare circuit;

means (42) for receiving the PAT_SEL data and for supplying the data pattern referenced thereby to said second compare circuit; and means (42, 50, 44, 46) for receiving the MODE_SEL data of each generated vector, for receiving the PAT_MATCH, INCODE_MATCH, and NEXT_CYCLE signals, for producing a pulse of the NEXT_VECTOR signal in response to a first pattern of state changes in said INCODE_MATCH, PAT_MATCH, and NEXT_CYCLE signals indicated by said MODE_SEL data, for transmitting a second code referenced by said MODE_SEL data to said first compare circuit, and for transmitting said third code referenced by said MODE_SEL data to said interface means to be forwarded on said output bus in response to a second pattern of state changes indicated by said MODE_SEL data.

* * * * *